(12) United States Patent
Zang et al.

(10) Patent No.: US 11,362,121 B2
(45) Date of Patent: Jun. 14, 2022

(54) LIGHT ATTENUATION LAYER FABRICATION METHOD AND STRUCTURE FOR IMAGE SENSOR

(71) Applicant: OMNIVISION TECHNOLOGIES, INC., Santa Clara, CA (US)

(72) Inventors: Hui Zang, San Jose, CA (US); Yuanliang Liu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 179 days.

(21) Appl. No.: 16/775,022

(22) Filed: Jan. 28, 2020

(65) Prior Publication Data
US 2021/0233947 A1      Jul. 29, 2021

(51) Int. Cl.
*H01L 27/146*      (2006.01)

(52) U.S. Cl.
CPC .... *H01L 27/14605* (2013.01); *H01L 27/1463* (2013.01); *H01L 27/14621* (2013.01); *H01L 27/14623* (2013.01); *H01L 27/14627* (2013.01); *H01L 27/14629* (2013.01); *H01L 27/14645* (2013.01); *H01L 27/14685* (2013.01); *H01L 27/14689* (2013.01)

(58) Field of Classification Search
CPC ...................................... H01L 27/14654–14656
See application file for complete search history.

(56) References Cited

U.S. PATENT DOCUMENTS

| | | | | |
|---|---|---|---|---|
| 6,850,278 B1 * | 2/2005 | Sakurai | ............. | H04N 5/35563 250/208.1 |
| 7,319,242 B2 * | 1/2008 | Shimizu | ............... | G02B 3/0031 257/294 |
| 7,446,294 B2 * | 11/2008 | Lin | ................... | H01L 27/14627 250/208.1 |
| 7,821,559 B2 * | 10/2010 | Kishi | .................... | H04N 5/359 348/308 |
| 9,372,286 B2 * | 6/2016 | Li | .................... | B29D 11/00451 |
| 9,590,005 B1 | 3/2017 | Qian et al. | | |
| 10,728,475 B2 * | 7/2020 | Yanagita | ................ | H04N 5/361 |
| 10,741,599 B2 * | 8/2020 | Yanagita | ............ | H04N 5/37452 |
| 10,811,453 B1 * | 10/2020 | Mun | ............. | H01L 27/1463 |

(Continued)

OTHER PUBLICATIONS

U.S. Appl. No. 16/687,660, filed Nov. 18, 2019, 47 pages.

*Primary Examiner* — Jarrett J Stark
(74) *Attorney, Agent, or Firm* — Christensen O'Connor Johnson Kindness PLLC

(57) ABSTRACT

An image sensor includes a substrate having a plurality of small photodiodes and a plurality of large photodiodes surrounding the small photodiodes. The substrate further includes a plurality of deep trench isolation structures in regions of the substrate between ones of the small photodiodes and the large photodiodes. Each of large photodiodes having a full well capacity larger than each of the small photodiodes. The image sensor further includes an array of color filters disposed over the substrate, a first and second buffer layer disposed between the substrate and the array of color filters, metal grid structures disposed between the color filters and above the first buffer layer, and an attenuation layer portion above a region of the substrate between ones of the large and small photodiodes, the attenuation layer portion is between the first and second buffer layers and normal to an upper surface of the substrate.

24 Claims, 12 Drawing Sheets

(56) References Cited

U.S. PATENT DOCUMENTS

| | | | | |
|---|---|---|---|---|
| 10,840,280 | B2* | 11/2020 | Tomekawa | H01L 27/14607 |
| 2004/0096124 | A1* | 5/2004 | Nakamura | H04N 5/35554 |
| | | | | 382/308 |
| 2005/0078377 | A1* | 4/2005 | Li | B29D 11/00365 |
| | | | | 359/619 |
| 2005/0110093 | A1* | 5/2005 | Altice | H01L 27/14654 |
| | | | | 257/359 |
| 2008/0211945 | A1* | 9/2008 | Hong | H04N 5/35563 |
| | | | | 348/294 |
| 2008/0266434 | A1* | 10/2008 | Sugawa | H04N 5/3591 |
| | | | | 348/308 |
| 2008/0290382 | A1* | 11/2008 | Hirota | H01L 27/14627 |
| | | | | 257/291 |
| 2010/0038523 | A1* | 2/2010 | Venezia | H01L 27/14629 |
| | | | | 250/216 |
| 2011/0076001 | A1* | 3/2011 | Iwasaki | H04N 9/04515 |
| | | | | 396/114 |
| 2011/0121162 | A1* | 5/2011 | Murata | H01L 27/14645 |
| | | | | 250/208.1 |
| 2011/0175981 | A1* | 7/2011 | Lai | H04N 13/254 |
| | | | | 348/46 |
| 2011/0215223 | A1* | 9/2011 | Unagami | H01L 27/148 |
| | | | | 250/208.1 |
| 2011/0228149 | A1* | 9/2011 | Naruse | H01L 27/1463 |
| | | | | 348/273 |
| 2012/0086845 | A1* | 4/2012 | Enomoto | H01L 27/14614 |
| | | | | 348/311 |
| 2012/0217601 | A1* | 8/2012 | Miyanami | H01L 27/1463 |
| | | | | 257/432 |
| 2012/0262616 | A1* | 10/2012 | Sa | H04N 5/35527 |
| | | | | 348/311 |
| 2014/0253767 | A1* | 9/2014 | Kato | H01L 27/14621 |
| | | | | 348/280 |
| 2015/0084144 | A1* | 3/2015 | Suzuki | H04N 9/04559 |
| | | | | 257/432 |
| 2016/0276396 | A1* | 9/2016 | Tayanaka | H01L 27/14685 |
| 2016/0372507 | A1* | 12/2016 | Yang | H04N 5/374 |
| 2017/0099422 | A1* | 4/2017 | Goma | H04N 5/369 |
| 2018/0115727 | A1* | 4/2018 | Yanagita | H04N 5/363 |
| 2018/0152650 | A1* | 5/2018 | Sakakibara | H04N 5/379 |
| 2018/0184025 | A1* | 6/2018 | Yanagita | H01L 27/14643 |
| 2018/0191973 | A1* | 7/2018 | Hirota | H04N 5/374 |
| 2018/0241955 | A1* | 8/2018 | Sakano | H04N 5/35563 |
| 2018/0308883 | A1* | 10/2018 | Yanagita | H04N 5/35563 |
| 2018/0366513 | A1* | 12/2018 | Yang | H04N 5/37452 |
| 2019/0019820 | A1* | 1/2019 | Takizawa | H01L 27/14614 |
| 2019/0043900 | A1* | 2/2019 | Oka | H01L 27/146 |
| 2019/0096933 | A1* | 3/2019 | Kido | H04N 5/369 |
| 2019/0098232 | A1* | 3/2019 | Mori | H04N 5/37455 |
| 2019/0222811 | A1* | 7/2019 | Yamaguchi | H01L 27/14647 |
| 2019/0341411 | A1* | 11/2019 | Lim | H01L 27/14641 |
| 2020/0154066 | A1* | 5/2020 | Johnson | H04N 5/3559 |
| 2020/0404204 | A1* | 12/2020 | Kawazu | H04N 5/37457 |
| 2021/0193727 | A1* | 6/2021 | Asatsuma | H04N 5/369 |
| 2021/0202554 | A1* | 7/2021 | Liu | H01L 27/14607 |
| 2021/0233947 | A1* | 7/2021 | Zang | H01L 27/1463 |
| 2021/0358993 | A1* | 11/2021 | Mao | H04N 5/3559 |

\* cited by examiner

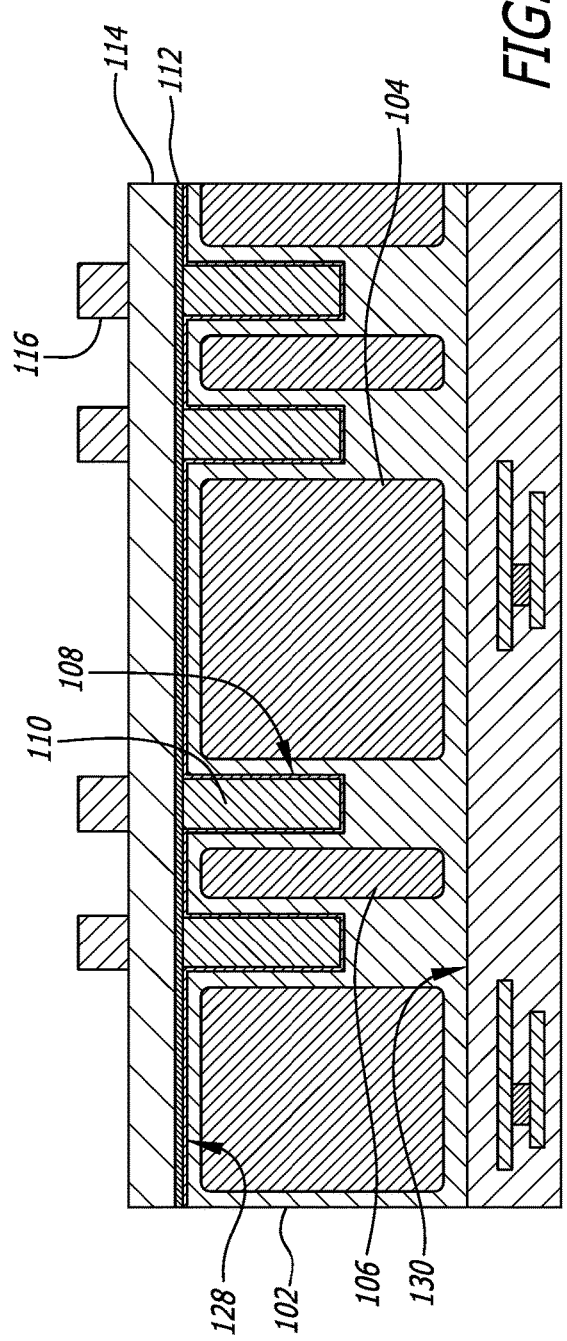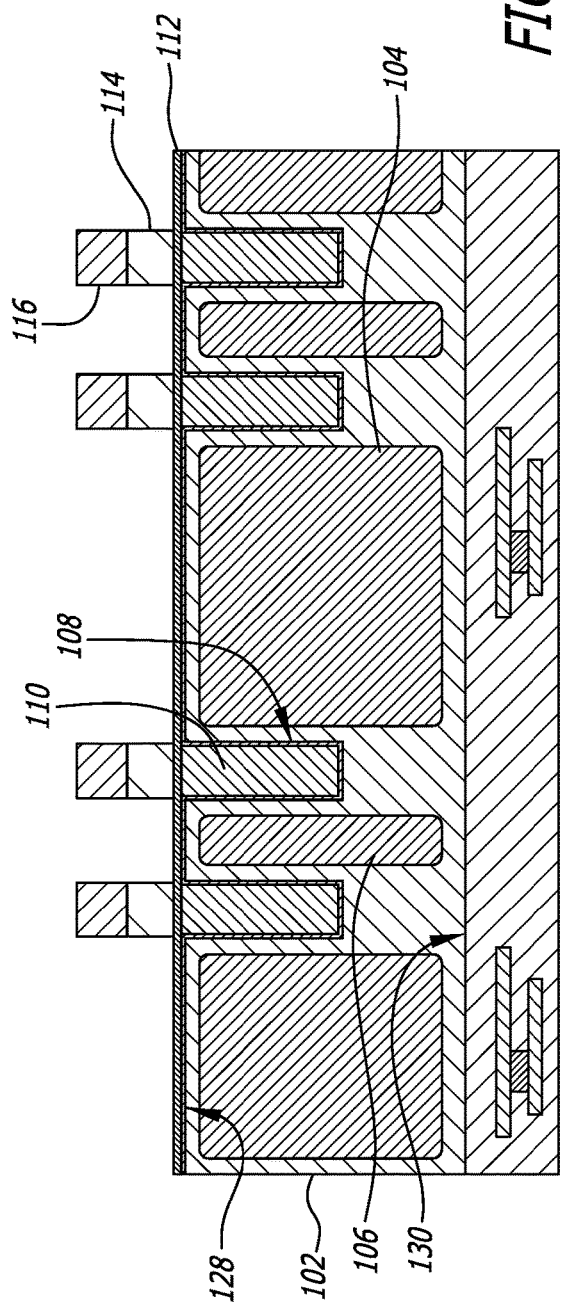

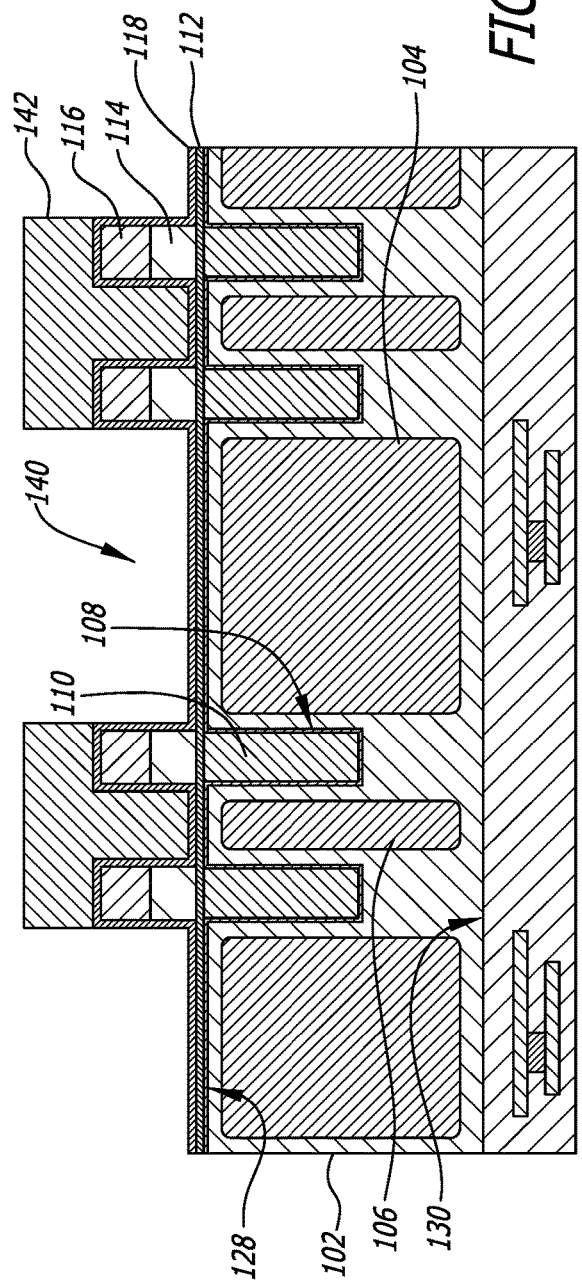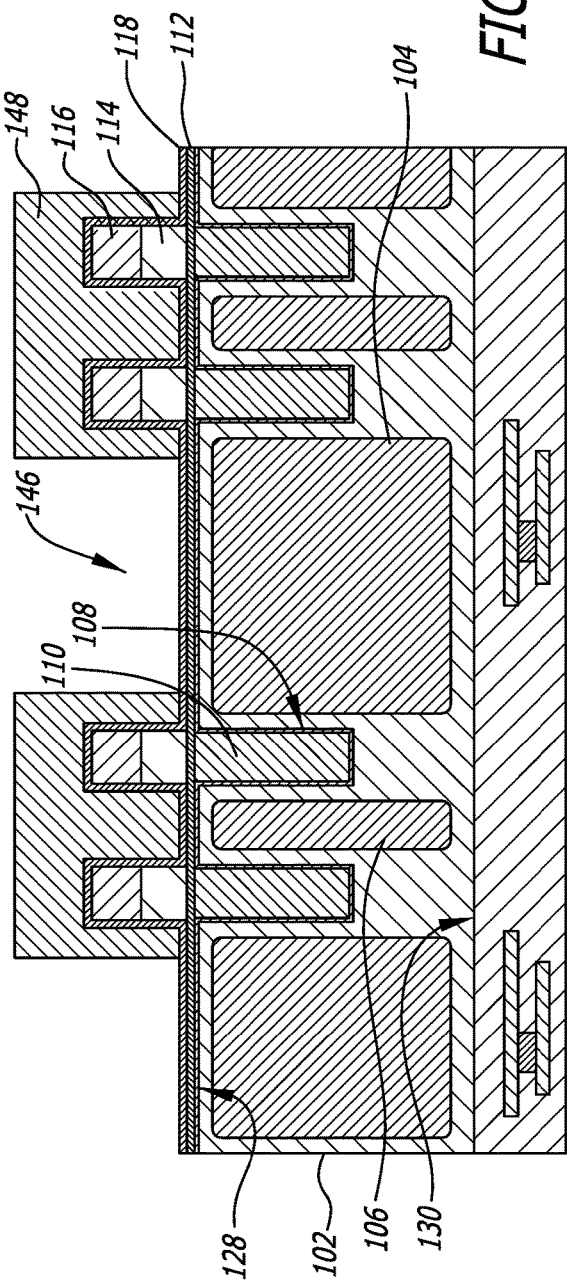

LIGHT ATTENUATION LAYER FABRICATION METHOD AND STRUCTURE FOR IMAGE SENSOR

BACKGROUND INFORMATION

Field of the Disclosure

This disclosure relates generally to image sensors, in particular to image sensor with split pixel structures.

Background

Image sensors may be used in various devices including cameras, sensors, and consumer electronics. Image sensors with split pixel structures have photodiodes of different sizes. The different sized photodiodes may be utilized in different applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2-13 illustrate example cross sectional views of semiconductor structures in the process of fabricating image sensors in accordance with the teachings of the present invention.

Figure 1:
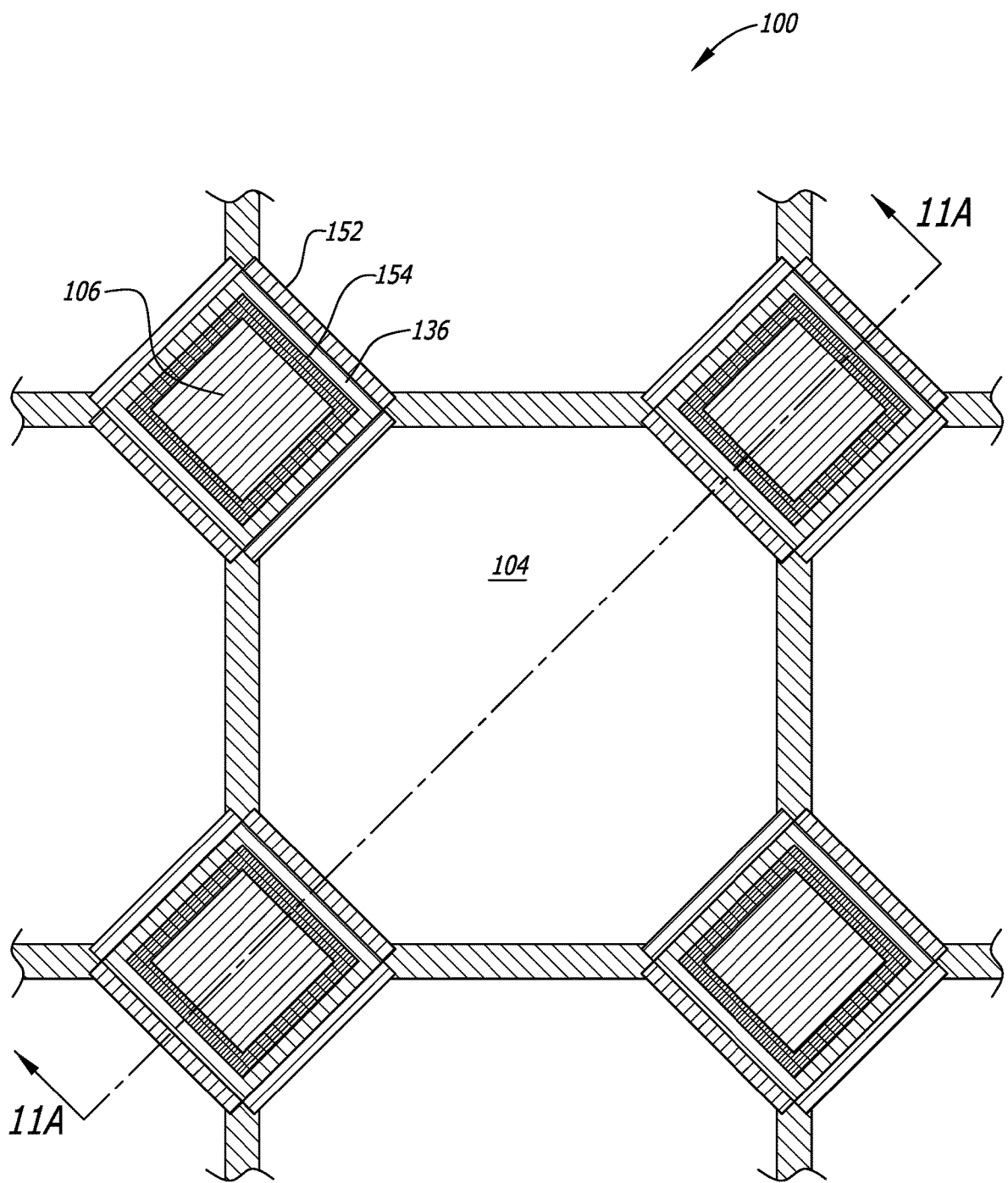
FIG. 1 illustrates a top view of a portion of an image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensors and devices and methods for fabricating image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors for color images may include color filters and microlenses to focus incident light. There may be a buffer layer between a substrate including photodiodes and the color filters. The image sensor may include large photodiodes for lower intensity light sensing, and small photodiodes for higher intensity light sensing arranged in a pixel array to realize high dynamic range (HDR) sensing. The large photodiodes may be arranged next to and surround the small photodiodes. A large photodiode may have a full well capacity that is greater than a full well capacity of a small photodiode, as such each of large photodiodes may accumulate more photoelectrons than the each of the small photodiodes. An attenuation layer may be disposed above and aligned with the small photodiodes. The attenuation layer may block a portion of incident light focused by the microlenses onto the small photodiodes such that the small photodiodes are not saturated by the high intensity light during an integration period of the image sensor since only a portion of the high intensity light will penetrate through the attenuation layer. Thus, the sensitivity of the small photodiodes to high intensity light may be improved by having the attenuation layer blocking a portion of the high intensity light. The integration period of the image sensor refers to an imaging operation period of the image sensor where all pixel cells of pixel array are exposed to incident light such that each of large and small photodiodes photogenerate and accumulate photo-charges in response the amount of incident light absorbed respectively so as to generate charge information corresponding to an image captured by the image sensor.

However, a problem arises when light hits the pixel cells at a high angle of incidence (with respect to the normal to the pixel array) that does not travel past the attenuation layer above the small photodiodes or by internally reflected light (for example by metal grid structure) that may pass or penetrate through the buffer layer without travel through the attenuation layer, and activate the respective small photodiode for absorption, or even saturate the respective small photodiode. This can cause deleterious effects on a sensing ability of the image sensor for high intensity light.

Accordingly, in examples according to this invention in order to reduce the amount of high angle incident light or the reflections of the high angle incident light from respective metal grid structure crosstalk over to the small photodiodes from the proximate large photodiodes, an attenuation layer portion on the sidewall of all or a portion of a buffer layer may be provided above large photodiodes without affecting much of the light sensitivity of the large photodiodes. The attenuation layer portion can be normal to the surface of the pixel cells.

As will be discussed, example image sensors disclosed herein have an architecture that improves performance of high intensity light sensing in image sensors. In one example, two buffer layer deposition steps are used in order to be able to fabricate an attenuation layer portion on a sidewall of the first buffer layer disposed proximate to an illuminated surface of the semiconductor substrate, wherein the attenuation layer portion is above and normal to the large photodiodes. This prevents high angle incident light or its reflections of the respective metal grid structure from deleteriously activating the small photodiodes for light absorption and saturate small photodiodes. These advantages are especially useful in split pixel structures such as large photodiode/small photodiode (LPD/SPD) image sensors, but is also applicable to other pixel structures.

To illustrate, FIG. 1 is a top view of example image sensors 101 having large and small pixel cells with correspondingly large 104 and small 106 photodiodes forming a pixel array. In one example, the small photodiodes 106 may be square and oriented 45 degrees from the orientation of the grid of large photodiodes 104. Both the small photodiodes 106 and the large photodiodes 104 may be surrounded by a metal grid 136 formed from a plurality of metal grid structures. The metal grid 136 improves the optical isolation of the small photodiodes 106 and the large photodiodes 104 by reflecting or absorbing light hitting the surface at a high angle of incidence (the angle between the incident light and a line normal to the surface). According to one example of the invention, the image sensors 101 include first attenuation layer portions 152 normal to the upper surface of the pixel cells and are above the large photodiodes 104. The image sensor 101 also includes second attenuation layer portions 154 disposed next to the metal grid 136 surrounding the small photodiodes 106. The second attenuation layer portions 154 extend at least over the small photodiodes 106, and optionally, extend over the top surface of the metal grid 136. In one example, the first attenuation layer portions 152 are disposed on a first buffer layer (not shown) and may partly extend on a sidewall of the metal grid 136. The first attenuation layer portions 152 may cover a narrow area above the large photodiode 104, since the thickness of the first attenuation layer portion 152 extends over the large photodiode 104 but the coverage of first attenuation layer portion 152 does not have much impact on the light sensitivity or the quantum efficiency of large photodiode 104. In one example, both the first attenuation layer portions 152 and the second attenuation layer portions 154 are etched in the same processing step from the same attenuation layer, and then utilizing a second buffer layer formation process. However, in one example, the first attenuation layer portions 152 and the second attenuation layer portions 154 may be deposited or etched in different processing steps. Various examples of attenuation layer portions extending normal from the pixel surface on a sidewall of a buffer layer and metal grid structure and above a large photodiode are also disclosed.

Crosstalk into the adjacent small photodiodes 106 during an integration operation of the image sensor 100 may saturate the adjacent small photodiodes 106 and affects the light sensitivity of the respective small photodiodes 106. Each of the second attenuation layer portions 154 is arranged to cover the entire light exposing areas of the respective small photodiodes 106, while each of the first attenuation layer portions 152 is arranged to cover at least a portion of the light exposing area of the respective large photodiodes 104 to reduce crosstalk from large photodiodes 104 into the adjacent small photodiodes 106 caused by light with a high incident angle received by the large photodiodes 104. In particular, the first attenuation layer portion 152 is arranged to extend in a direction normal to the upper surface of the pixel cell.

In the depicted example, the image sensor is depicted as a single large photodiode 104 with four small photodiodes 106. However, the image sensor 100 can comprise any number of large 104 and small photodiodes 106. The concepts described herein may apply to other photodiode layouts and pixel architectures. Exemplary methods for making the first attenuation layer portion 152 and the second attenuation layer portion 154 is described with reference to FIGS. 2 to 13.

Figure 2:
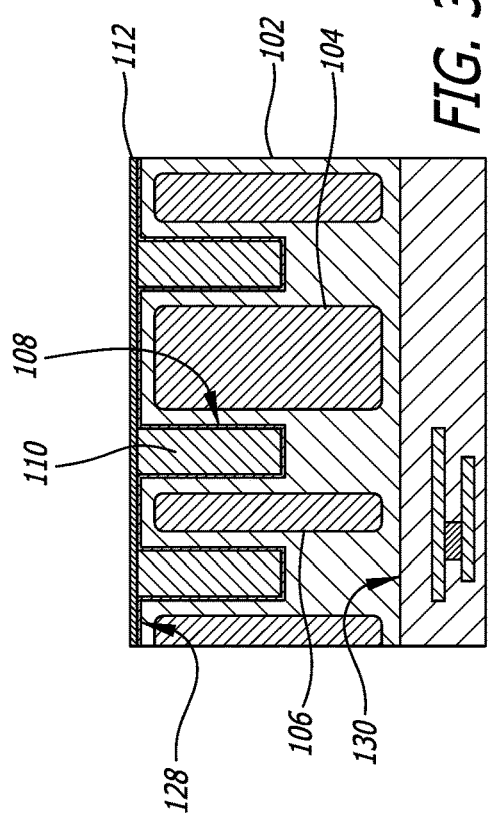

FIG. 2 shows a cross section of a semiconductor structure 101 at a step in the fabrication of image sensors 100 according to the present invention. The semiconductor structure 101 includes a substrate material 102 in which large photodiodes 104 have been formed adjacent to small photodiodes 106. A plurality of deep trench isolation structures 108 formed between adjacent photodiodes e.g., between the large 104 and small photodiodes 106 providing pixel isolation have been etched and filled with an dielectric material 110 on a first side 128 (also refer to as backside 128) of the substrate material 102. An interlayer dielectric layer including metal conductors may also be fabricated on a second side 130 (also refer to frontside 130) of the substrate material 102, wherein the second side 130 is opposite to the first side 128. In one example, the first side 128 may be referred as an illuminated side of the substrate material 102, and the second side 130 may be referred as a non-illuminated side of the substrate material 102.

In one example, the image sensor 100 is constructed to receive incident light through the backside 128 of substrate material 102. The large photodiode 104 may be configured to have a full well capacity that is greater than a full well capacity of the small photodiode 106, i.e., the large photodiode 104 may store more photo-generated charges than the small photodiode 106. In one example, the large photodiode 104 may have a pixel size that is at least twice of the pixel size of the small photodiode 106. Alternatively, the large photodiode 104 has a larger light exposure area than the light exposure area of the neighboring small photodiode 106. In one example, the small photodiode 106 may be arranged to be surrounded by two or more large photodiodes 104.

In the illustrated example, the large photodiode 104 with higher sensitivity incident light may be utilized for low light intensity sensing. The small photodiode 106 has less light exposure area and is less sensitive to high intensity light compared to the large photodiode 104, and therefore may be utilized for higher light intensity sensing. By including an array of large photodiodes 104 and small photodiodes 106 in the image sensor 100, high dynamic range (HDR) imaging sensing can be realized.

The plurality of deep trench isolation structures 108 are formed on the backside 128 of substrate material 102 and each of the deep trench isolation structures 108 is arranged to extend from the backside 128 of the substrate material 102 toward the opposite surface (frontside 130). FIG. 2 may illustrate a semiconductor structure 101 provided after front-end of line process, which may include formation of photodiode, floating diffusion region, pixel transistor and metal interconnection structures. FIG. 2 may be a semiconductor structure 101 at the beginning of back-end of line process. The substrate material 102 may be a semiconductor substrate, such as silicon substrate, a doped silicon substrate, such as n-type doped silicon substrate or p-type doped substrate, a silicon on insulator substrate, or any suitable substrate material. The large and small photodiodes 104, 106 may be formed in the substrate material 102, for example, by implanting photodiode regions on the frontside 130 of the substrate material 102 using ion implantation with suitable dopants. In some examples, photodiodes 104, 106 may be n-type photodiodes formed in a p-type silicon substrate material 102. However, in other embodiments, the polarity may be reversed, for example, photodiodes 104, 106 may be p-type photodiodes formed in the n-type silicon substrate material 102. Each of the plurality of deep trench isolation structures 108 may include electrically insulating materials such as polymer or oxide. The plurality of deep trench isolation structures 108 may be formed between the adjacent large 104 and small 106 photodiodes to prevent electrical and/or optical crosstalk between the adjacent large and small photodiodes 104, 106. In one example, the deep trench isolation structures 108 are filled with dielectric material 110 (such as silicon oxide), reflective metal material, or a combination thereof.

Figure 3:
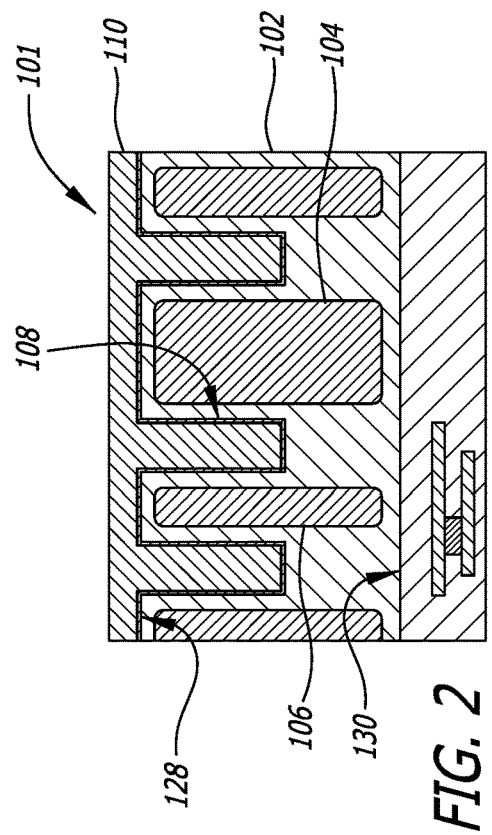

In FIG. 3, the dielectric material 110 has been reduced to the level of the substrate material 102. In one example, the process for reducing the dielectric material 110 is via a chemical mechanical polishing process. Thereafter, an etch-stop layer 112 is deposited over the entire backside 128 of substrate material 102 and covering the tops of the plurality deep trench isolation structures 108. In this step, the etch-stop layer 112 is chosen so that a first buffer layer to be added will preferentially be etched. Restated, the materials selected for the etch-stop layer 112 have different etching selectivity (e.g., slower etching rate to etching agent) over the first buffer layer. In one example, the etch-stop layer 112 is an oxynitride. In one example, the thickness of the etch-stop layer 112 is from 100 Å to 300 Å.

Figure 4:
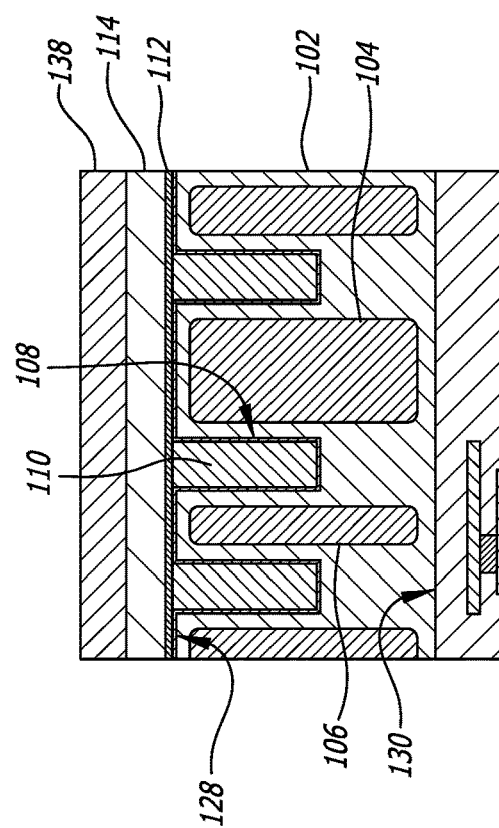

In FIG. 4, a first buffer layer 114 is deposited on the etch-stop layer 112. In one example, the first buffer layer 114 is an oxide selected from a dielectric material, such as silicon dioxide. In one example, the thickness of the first buffer layer 114 is from 1000 Å to 1300 Å. In one example, the first buffer layer 114 may be grown from the substrate material 102, for example by thermal oxidation processes. In one example, the first buffer layer 114 may be deposited on the substrate material 102, for example by chemical vapor deposition.

Figure 5:
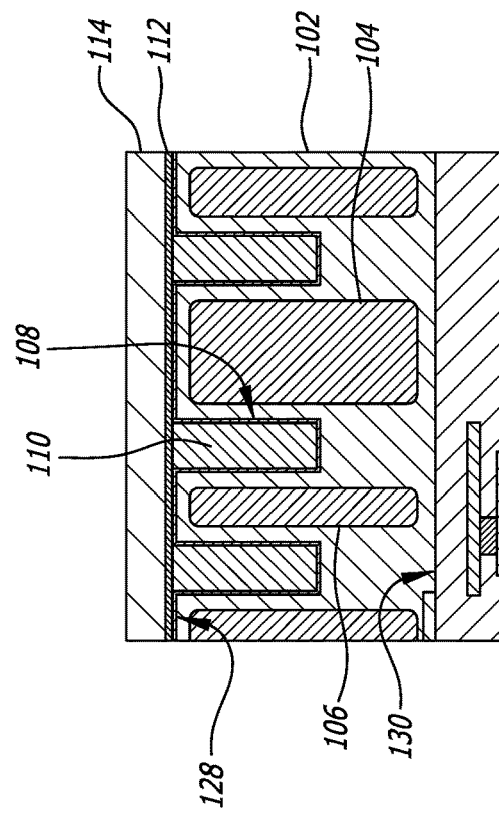

In FIG. 5, a metal layer 138 is deposited on the first buffer layer 114. The metal layer 138 is for forming the buried metal grid 136. In one example, the metal layer 138 is selected from tungsten or aluminum. In one example, the metal layer 138 has a thickness from about 1000 Å to 2000 Å. The thickness of the metal layer 138 may be configured based on the required height of metal grid structures of the metal grid 136. In one example, the required height of metal grid structures of the metal grid 136 may depend on the height or thickness of color filters. Then, processing includes forming a mask pattern on the metal layer 138 by using a lithography process and using the mask pattern to etch the metal layer 138 to form the plurality of metal grid structures forming the metal grid 136.

In FIG. 6, the metal layer 138 is patterned and etched to form a plurality of metal grid structures 116 on the first buffer layer 114. In the illustrated example, each metal grid structure 116 is arranged to align with the each respective deep trench isolation structure 108. For example, each metal grid structure 116 coinciding above the deep trench isolation structures 108, such as illustrated in FIG. 1. However, in some embodiments, depending on the requirement of chief ray angle for the image sensor 100 and the location of pixel cell, some metal grid structures 116 may be slightly misaligned (e.g., slight shift to the right or left) with the centerline of the respective deep trench isolation structure 108.

In FIG. 7, a self-aligning etch based on the metal grid structures 116 formed in FIG. 6 is performed. In one example, a dry etch is performed on the first buffer layer 114, which etches the first buffer layer 114 to the etch-stop layer 112 and leaves the first buffer layer 114 in a similar grid pattern as the metal grid structures 116. The etching of the first buffer layer 114 leaves the first buffer layer 114 with sidewalls coincident with the sidewalls of the metal grid structures 116.

Figure 8:
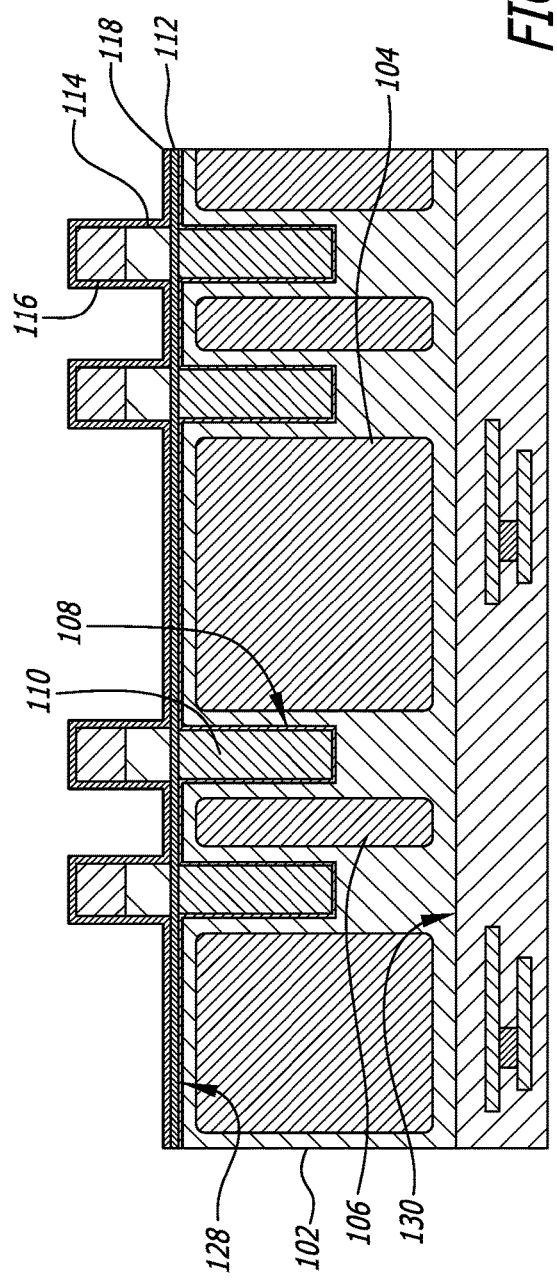

In FIG. 8, an attenuation layer 118 is blanket deposited covering the sidewalls and tops of the metal grid structures 116 formed from the metal layer 138, the sidewalls of the first buffer layer 114, and the exposed regions of the etch-stop layer 112. In one example, deposition of the attenuation layer 118 is by an anisotropic process, for example, chemical vapor deposition, physical vapor deposition, or atomic layer deposition. The attenuation layer 118 is subsequently etched to cover the light sensing area of the small photodiodes 106 such that the first and second attenuation layer portions 152, 154 remaining of the attenuation layer 118 can attenuate incident light directed to the small photodiodes 106, for example, through absorption to reduce the amount of incident light reaching the small photodiodes 106, thereby preventing the small photodiodes 106 from becoming saturated during the integration period of image sensor 100. The attenuation layer 118 may be formed from titanium, titanium nitride, tantalum, aluminum, tungsten, or a combination thereof. In one example, the attenuation layer 118 may be a single layer or a multi-layer stack structure. In one example, the attenuation layer 118 may include a first layer (e.g., Ti layer) and a second layer (e.g., TiN layer). For example, after forming a first layer of titanium with a first thickness, nitrogen is injected to react with the titanium to form the second layer of titanium nitride. In one example, the titanium layer may be about 30 nm to 100 nm thick, and the titanium nitride layer may be about 20 nm to 80 nm thick. The thickness of the first and second or the total attenuation layer 118 may be adjusted based on the desired penetration or transmittance of incident light to the small photodiodes 106.

Figure 9A:
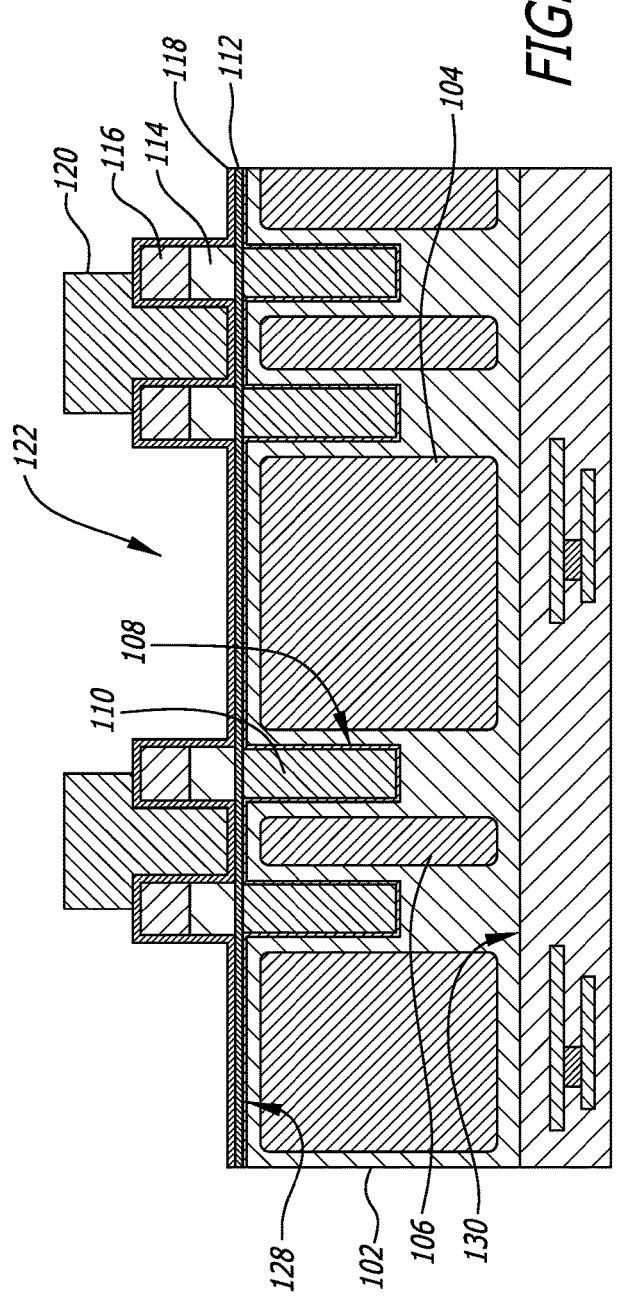

In FIG. 9A, a photoresist layer 120 is deposited and patterned on the attenuation layer 118 with openings 122 above the large photodiodes 104. Depending on the width of the openings 122 in the photoresist layer 120, the attenuation layer 118 can be formed to attain different coverage over the small photodiodes 106, the metal grid structures 116, and partly over the large photodiodes 104. In one example, the openings 122 extend at least to expose the attenuation layer 118 on the sidewalls of the first buffer layer 114 and the metal grid structures 116 facing the large photodiodes 104. In one example, the openings 122 extend above the large photodiodes, and along the sidewalls of the first buffer layer 114 and the metal grid structure 116 facing the large photodiodes 104, and partway along the top of the metal grid structure 116. In one example, the photoresist layer 120 is patterned to cover the regions above the small photodiodes 106.

In FIG. 9B, in one example, different openings 140 in the photoresist layer 142 compared to FIG. 9A are created above the large photodiodes 104 which extend along the sidewalls of the first buffer layer 114 and the metal grid structure 116 facing the large photodiodes 104. In other words, the openings 140 extend to the top edge of the metal grid structure 116, meaning that the photoresist layer 142 after patterning covers the full top of the metal grid structures 116 and the small photodiodes 106. Restated, the edges of the openings 140 are coincident with the attenuation layer 118 on the sidewalls of the stack structure comprising the first buffer layer 114 and metal grid structure 116.

In FIG. 9C, in one example, the openings 146 in the photoresist layer 148 above the large photodiodes 104 extend laterally to a distance from the edge of the first buffer layer 114 and the metal grid structure 116, meaning that the photoresist layer 148 after patterning covers part of the region above large photodiodes 104, but leaves the openings 146 in the central region above the large photodiodes 104.

Figure 10A:
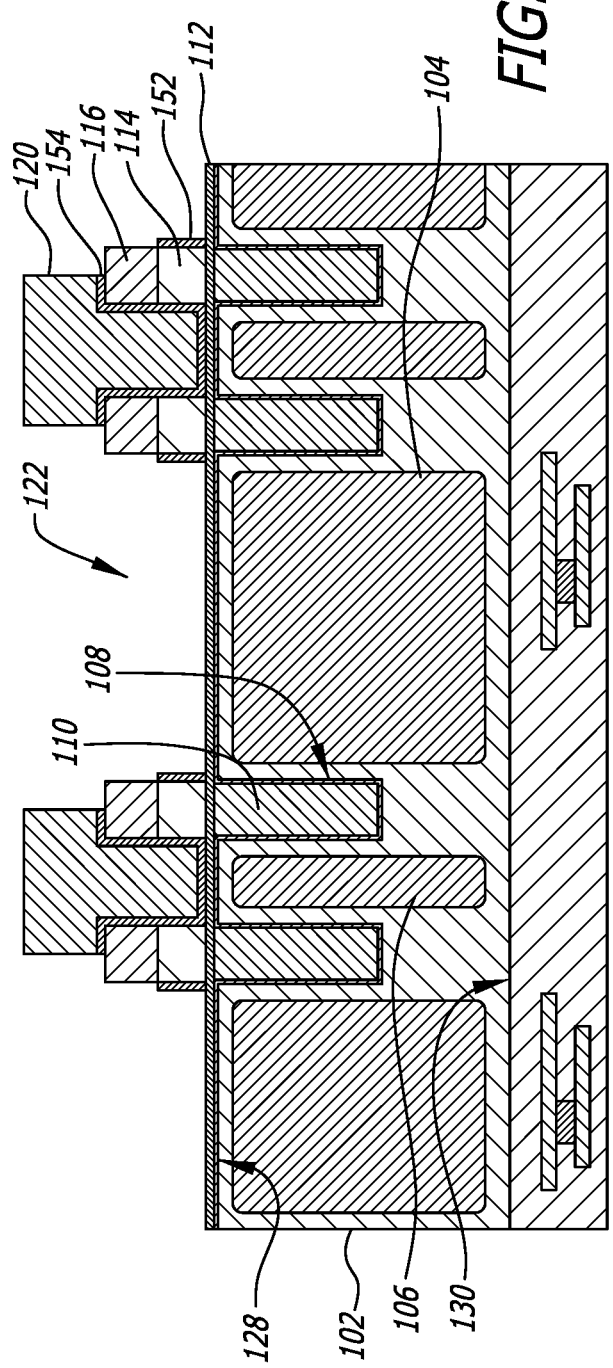

In FIG. 10A, with the photoresist layer 120 in the desired pattern, an etch is performed to remove the attenuation layer 118 in the openings 122 of photoresist layer 120 covering the large photodiodes 104. In one example, the etching includes removing a portion of the attenuation layer 118 from the top and sidewall of the metal grid structures 116 adjacent to the nearby large photodiodes 104, thereby resulting in a plurality of the first attenuation layer portions 152 and a plurality of the second attenuation layer portions 154, such that the first attenuation layer portions 152 are left remaining on the sidewalls of the first buffer layer 114 and optionally, depending on the length of the etching process and etching agent, the first attenuation layer portions 152 may also partly remain on the sidewall of each of the metal grid structures 116. In one example, the first attenuation layer portion 152 is separated from the second attenuation layer portion 154. Stated differently, the first attenuation layer portion 152 is not continuous with the second attenuation layer portion 154. In one example, the first attenuation layer portion 152 remains on the entire sidewall of the first buffer layer 114 and partly on the sidewall of the metal grid structure 116. In one example, a first attenuation layer portion 152 remains on part of the sidewall of the buffer layer pattern blocks of first buffer layer 114, and none on the sidewall of the metal grid structures 116. The illustrated first attenuation layer portions 152 remaining on the sidewall of the metal grid structures 116 are also formed on the etch-stop layer 112. The first attenuation layer portions 152 are normal to the backside 128 of the substrate material 102, and normal to the large photodiodes 104 such that the thickness of the first attenuation layer portions 152 cover at least a portion above the large photodiodes 104. However, the thickness of the first attenuation layer portions 152 can vary with the combination height of metal grid structure 116 and the first buffer layer 114 as well as the etching process of the attenuation layer 118.

Figure 11A:
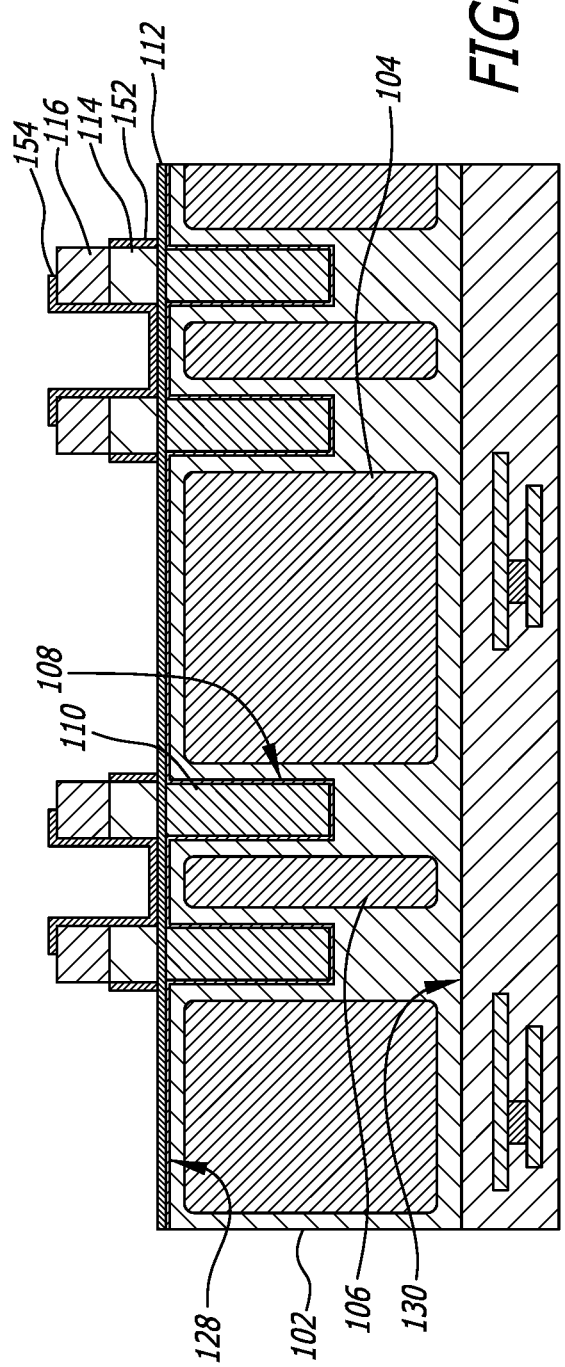

In FIG. 11A, the photoresist layer 120 is removed and the surface cleaned thereafter during a photoresist strip and clean process. After removal of the photoresist layer 120, the second attenuation layer portions 154 that were protected with the photoresist layer 120 are exposed. In one example, the second attenuation layer portions 154 cover the regions above the small photodiodes 106. In one example, the second attenuation layer portions 154 cover the sidewalls of the first buffer layer 114 and the sidewalls of the metal grid structures 116 that are facing the small photodiodes 106. Further, the second attenuation layer portions 154 can cover part of the tops of the metal grid structures 116. For example, the second attenuation layer portion 154 extends from a top of a metal grid structure 116, along a sidewall of the metal grid structure 116 and the first buffer layer 114, on the etch-stop layer 112 over the small photodiode 106, along a sidewall of an adjacent second metal grid structure and first buffer layer, to a top of the adjacent second metal grid structure. In one example, the first attenuation layer portions 152 and the second attenuation layer portions 154 collectively cover the light exposure area of the small photodiodes 106 above the backside 128 of the substrate material 102 such that incident light with high angle intended to be directed to large photodiodes 104 can be attenuated by the first attenuation layer portions 152 and the second attenuation layer portions 154 before crosstalk over to small photodiodes 106, thus reduce the amount crosstalk from large photodiodes 104 to small photodiodes 106 and improve light sensitivity of small photodiodes 106.

Figure 10B:
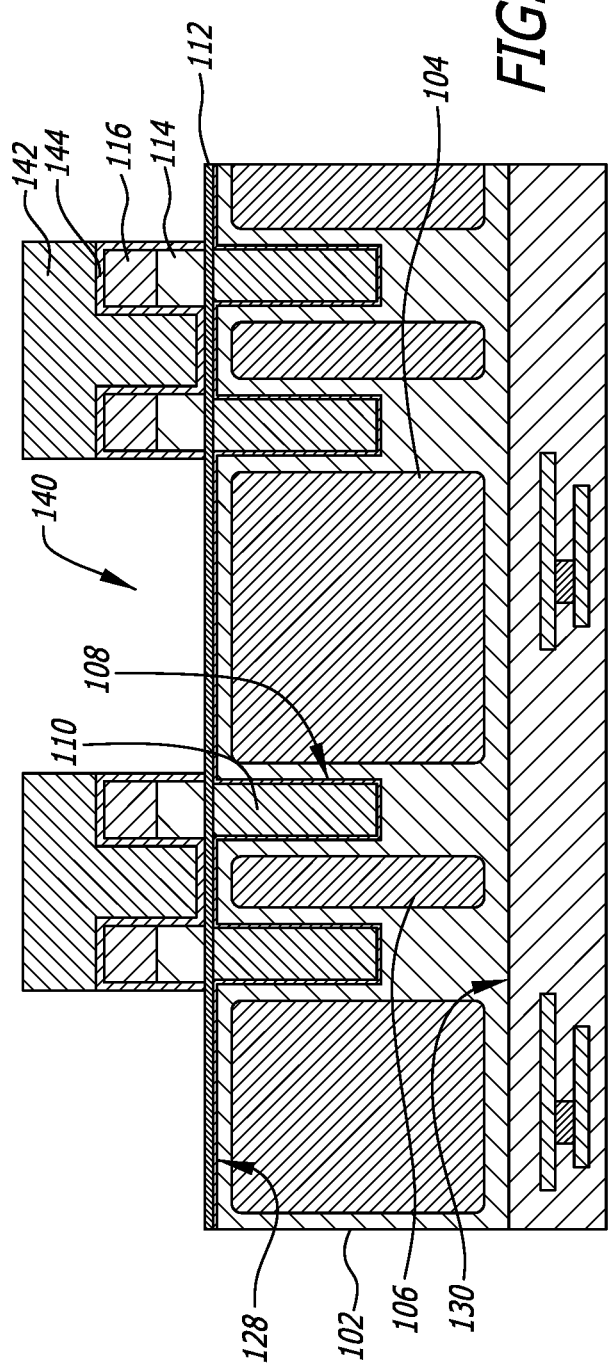

In FIG. 10B, corresponding to the pattern of the photoresist layer 142 of FIG. 9B, an etch is likewise performed to remove the attenuation layer 118 exposed in the openings 140. In one example, the etching includes removing a portion of the attenuation layer 118 from the backside 128 over the large photodiodes 104 leaving attenuation layer portions 144. Attenuation layer portion 144 covers the backside 128 above the small photodiodes 106 and the sidewalls and tops of the stack structures including the first buffer layer 114 and the metal grid structure 116. The attenuation layer portion 144 over the large photodiode 104 is the part that is normal to the backside 128, and normal to the large photodiode 104 such that the attenuation layer portion 144 covers each stack structure of the first buffer layer 114 and the metal grid structure 116 entirely without causing impact to the light sensitivity of the corresponding large photodiode 104. The thickness of the attenuation layer portion 144 may extend and cover at least a portion above the large photodiode 104. However, the thickness of the attenuation layer portion 144 may vary with the combination height of the metal grid structure 116 and the first buffer layer 114 as well as the etching process of the attenuation layer 118. Thus, in the finished structure, the attenuation layer portion 144 will have a part disposed above each region of the substrate material 102 between the large 104 and small 106 photodiodes, wherein the attenuation layer portions 144 have such part at least disposed between the first 114 and the second 124 buffer layers and normal to an upper surface (e.g., backside 128) of the substrate material 102 that extends over large photodiode 104.

Figure 11B:
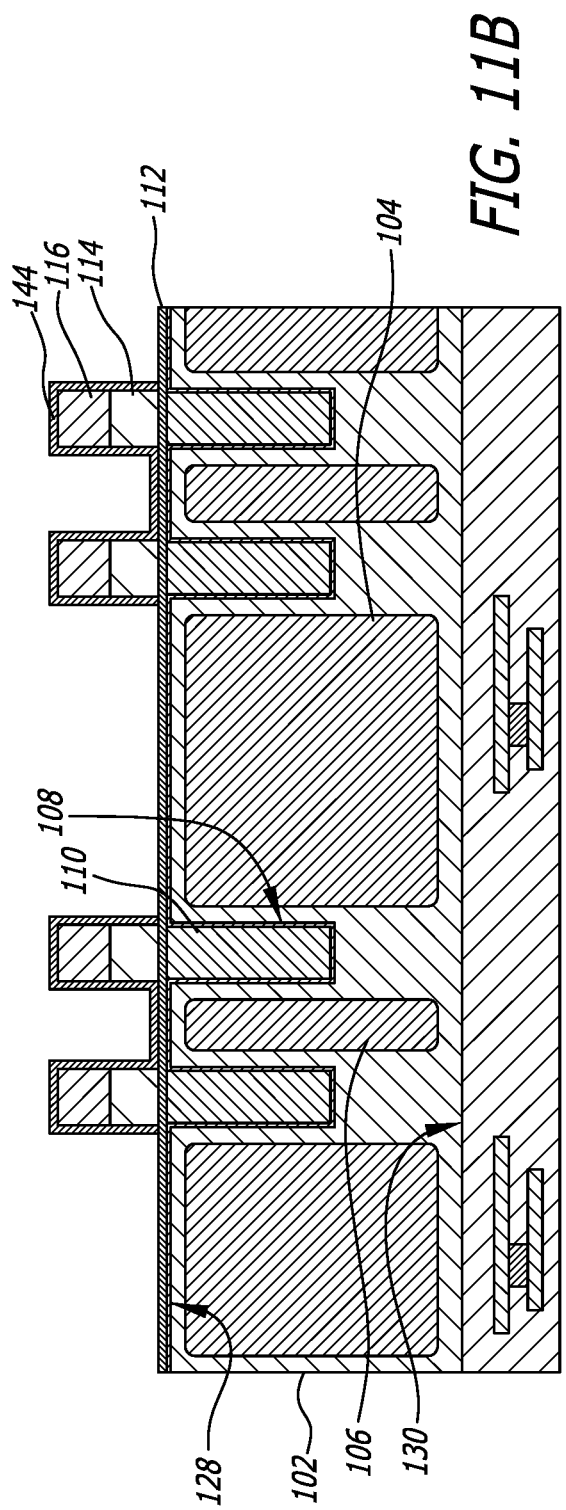

In FIG. 11B, the photoresist layer 142 is removed and the surface cleaned thereafter during a photoresist strip and clean process. After removal of the photoresist layer 142, the attenuation layer portions 144 remaining after the etching process that were protected with the photoresist layer 142 are exposed. In one example, the attenuation layer portions 144 cover the light exposure area of the small photodiodes 106 above the backside surface of the substrate material 102 such that incident light with high angle intended to be directed to large photodiodes 104 can be attenuated by the attenuation layer portions 144 before crosstalk over to small photodiodes 106, thus reduce the amount crosstalk from large photodiodes 104 to small photodiodes 106 and improve light sensitivity of small photodiodes 106.

Figure 10C:
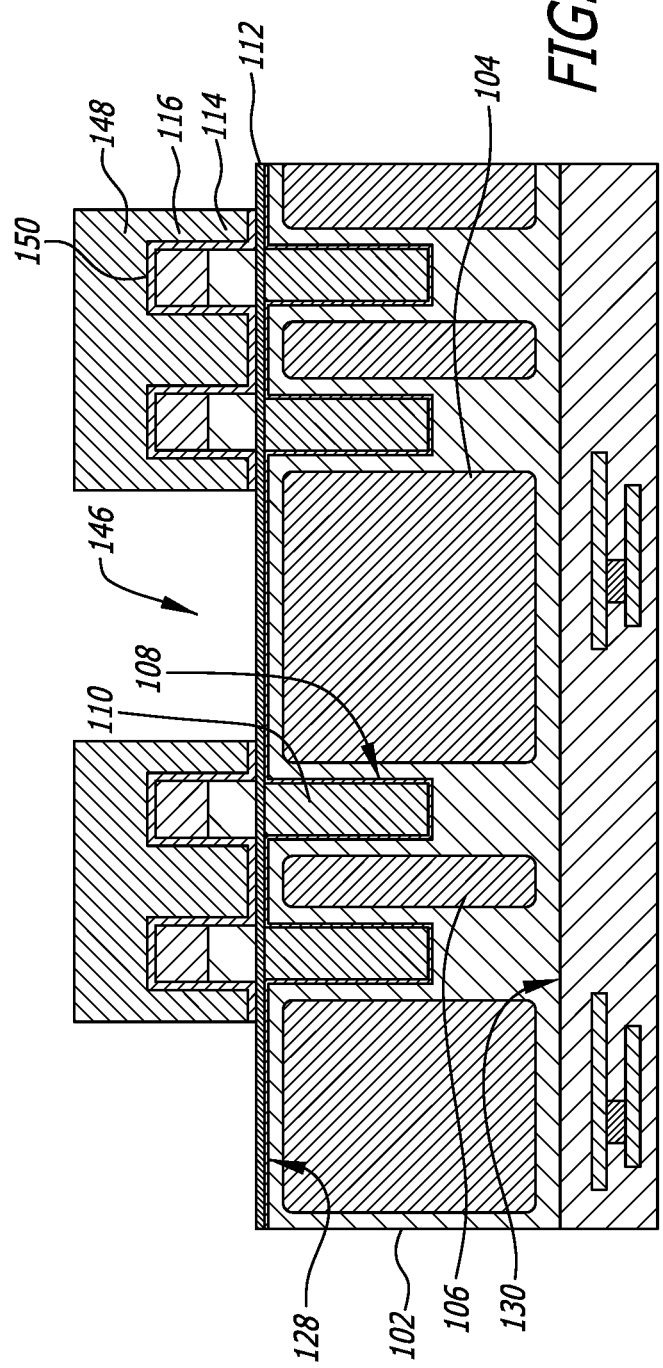

In FIG. 10C, corresponding to the pattern of the photoresist layer 148 of FIG. 9C, an etch is likewise performed to remove the attenuation layer 118 exposed in the openings 146. In one example, the etching includes removing a portion of the attenuation layer 118 from the backside 128 over the large photodiodes 104 leaving attenuation layer portions 150. Attenuation layer portion 150 covers the backside 128 above the small photodiodes 106 and the sidewalls and tops of the stack structures including the first buffer layer 114 and the metal grid structure 116, and further extends laterally on the backside 128 a distance over into the light exposing area of the adjacent large photodiodes 104 (e.g., large photodiodes 104 next to the stack structures of the first buffer layer 114 and the metal grid structure 116). Thus, in the finished structure, the attenuation layer portion 150 will have a part disposed above each region of the substrate material 102 between the large 104 and small 106 photodiodes, wherein the attenuation layer portions 150 have such part at least disposed between the first 114 and second 124 buffer layers and normal to an upper surface (for example the backside 128) of the substrate material 102 that extends over large photodiode 104.

Figure 11C:
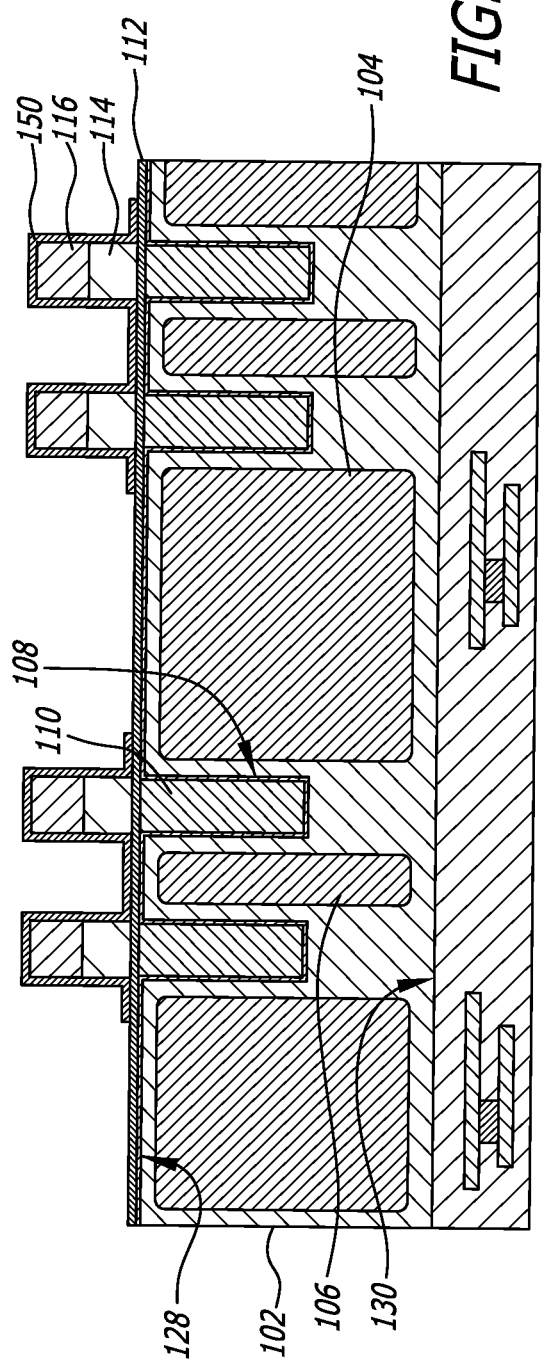

In FIG. 11C, the photoresist layer 148 is removed and the surface cleaned thereafter during a photoresist strip and clean process. After removal of the photoresist layer 148, the attenuation layer portions 150 that were protected with the photoresist layer 148 are exposed. In one example, the attenuation layer portions 150 cover the entire light exposure area of the small photodiodes 106 above the backside surface of the substrate material 102 and a small portion of the light exposure area of the large photodiodes 104 above the backside surface of the substrate material 102 such that incident light with high angle intended to be directed to the large photodiodes 104 can be attenuated by the attenuation layer portions 150 before crosstalk over to small photodiodes 106, thus reduce the amount crosstalk from large photodiodes 104 to small photodiodes 106 and improve light sensitivity of small photodiodes 106. It is appreciated by those skilled in the art, the portion of the light exposure area of the large photodiodes 104 covered by the remaining attenuation layer portions 150 is small (i.e., the extended distance of the attenuation layer portions 150 is small) and have negligible effect to the quantum efficiency of the corresponding large photodiodes 104.

Figure 12:
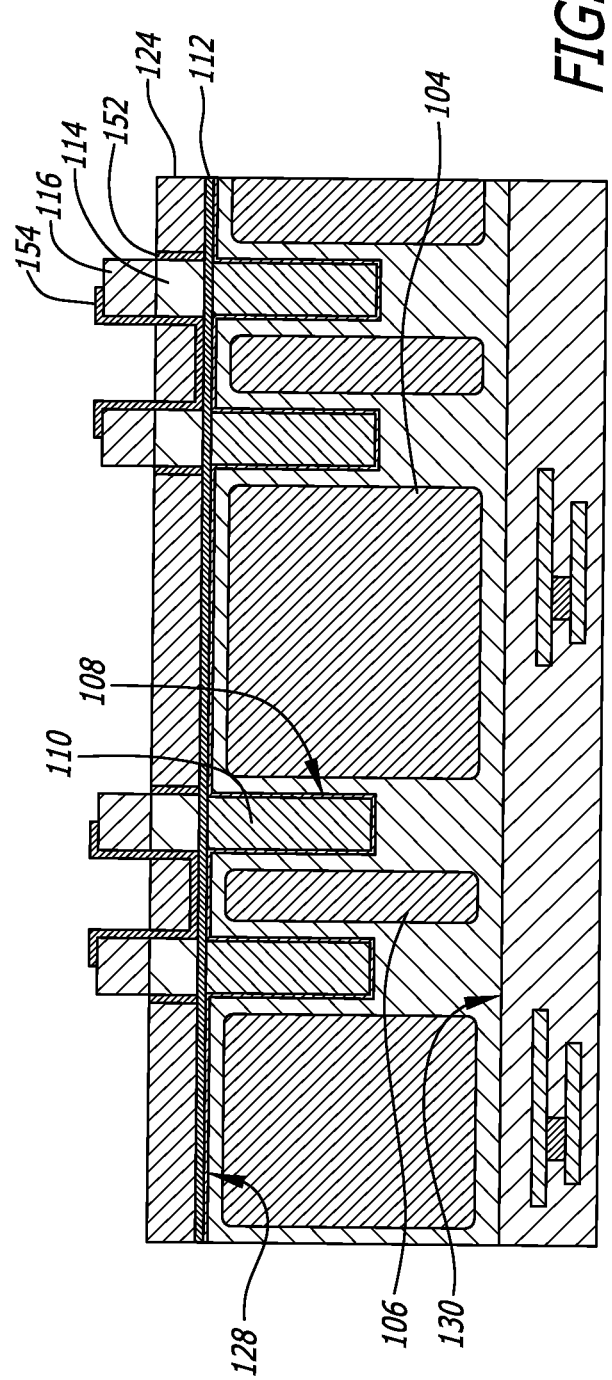

In FIG. 12, the second buffer layer 124 is deposited. The first attenuation layer portions 152 and second attenuation layer portions 154 are illustrated; however, the remainder of the processes after FIGS. 11B, and 11C are similar for the attenuation layer portions 144 and 150 of FIGS. 11B and 11C, respectively. The second buffer layer 124 is deposited to cover the areas above the large 104 and small 106 photodiodes on the etch-stop layer 112. In one example, the second buffer layer 124 is a flowable inorganic polymer material, such as a flowable oxide. After deposition, the second buffer layer 124 is etched according to the metal grid structures 116 such that the second buffer layer 124 fills the gaps between the metal grid structures 116 to the level of the first buffer layer 114. In one example, the second buffer layer 124 is formed from a material that is the same material as the first buffer layer 114, for example both formed of silicon dioxide. In one example, the second buffer layer 124 is formed from a material different from the first buffer layer 114, for instance, the first buffer layer 114 may be formed from flowable oxide and the second buffer layer 124 may be formed from silicon dioxide.

In embodiments, the first attenuation layer portions 152 (as well as parts of attenuation layer portions 144 and 150) are sandwiched between the first buffer layer 114 and the second buffer layer 124. The first attenuation layer portions 152 may be disposed normal to an upper surface (e.g., backside 128) of the substrate material 102. In one example, the first attenuation layer portions 152 extend from an etch-stop layer on the upper surface of the substrate material 102 to at least the level of one the first and the second buffer layers 114, 124. First attenuation layer portions 152 are not continuous with second attenuation layer portions 154. However, attenuation layer portions 144 and 150 of FIGS. 11B, 11C are continuous and have the part on the sidewall connected to the part over the small photodiodes so as to fully cover the sidewalls and tops of the stack structures of first buffer layer 114 and metal grid structure 116 facing the large and small photodiodes 104, 106.

Figure 13:
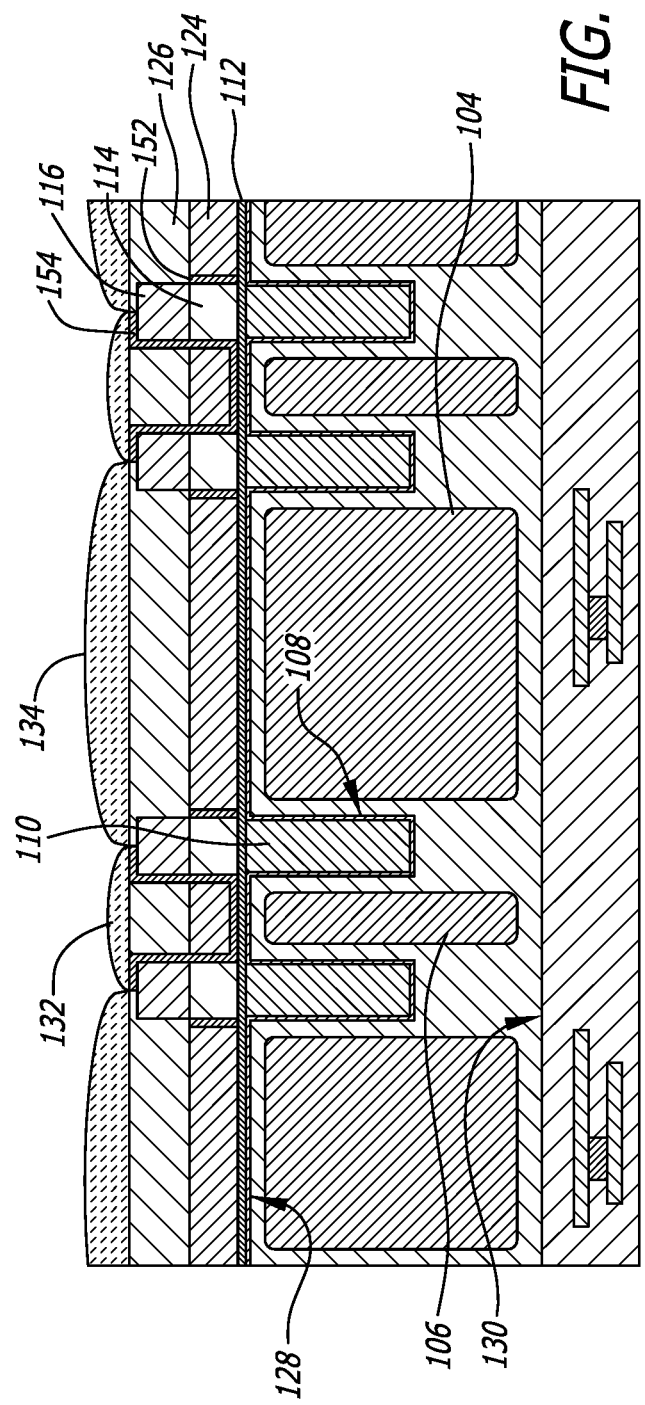

In FIG. 13, color filter materials are deposited for forming a color filter layer 126 having an array of buried color filters above the photodiodes. Each of the buried color filters is aligned with corresponding large and small photodiodes 104, 106 and surrounded by the stacked structure of the corresponding first buffer layer 114 and metal grid structures 116. The color filter materials may be deposited on the second buffer layer 124 and on the first attenuation layer portions 152 and the second attenuation layer portions 154 (or the attenuation layer portions 144 and 150 of FIGS. 11B, 11C, respectively) and the exposed parts of the metal grid structures 116. Each of the stacked structures of the first buffer layer 114 and metal grid structure 116 is sandwiched between adjacent color filters. Thereafter, an array of microlenses may be formed on the color filter layer 126. A small microlens 132 is formed on a first color filter of the color filter layer 126 aligned with the small photodiode, and a large microlens 134 is formed on a second color filter of the color filter layer 126 aligned with the large photodiode. Mircolenses 132, 134 operate to direct and focus incident light onto the respective photodiodes. The crosstalk due to light hitting at a high angle of incidence may be reduced further by the presence of the first attenuation layer portions 152 (and the parts of attenuation layer portions 144, 150) on the sidewalls of the first buffer layer 114, and optionally on the sidewalls of the metal grid structures 116. In some embodiments, a first height of a small microlens 132, i.e., a distance between the top of microlens 132 and the respective color filter may be different from a second height of microlens 134, i.e., the distance between the top of microlens 134 and the respective color filter. For example, the second height of microlens 134 may be greater than the first height of microlens 132, i.e., microlens 134 is taller than the microlens 132, to compensate curvature differences between microlens 132 and microlens 134 such that microlens 132 and microlens 134 have substantially the same focal length for the respective photodiodes 104, 106.

Figure 14:
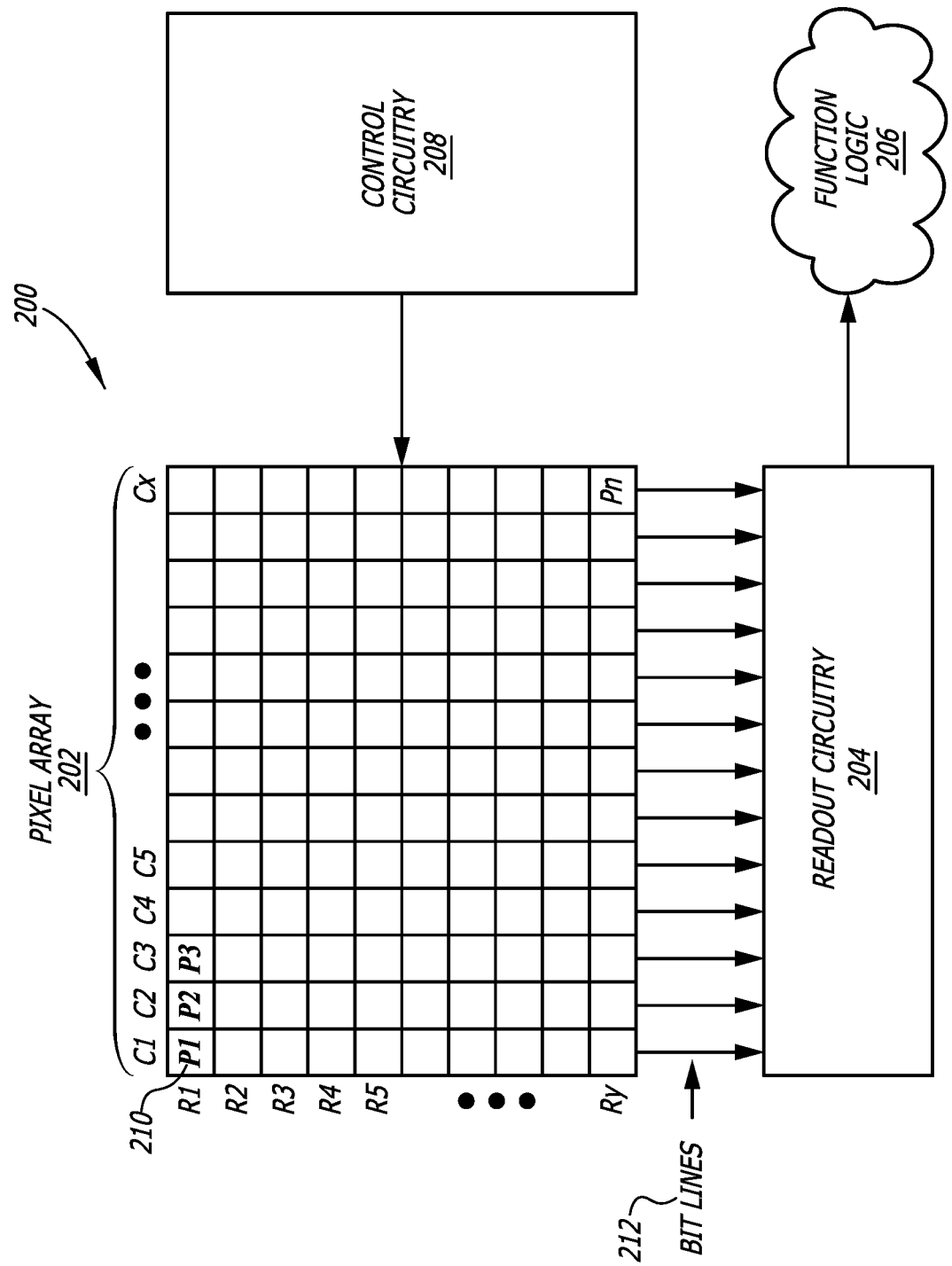
FIG. 14 is a diagram illustrating one example of an imaging system with a pixel array in accordance with the teachings of the present invention.

FIG. 14 is a diagram illustrating one example of an imaging system 200 with a pixel array 202 in accordance with the teachings of the present invention. As shown in the depicted example, an imaging system 200 includes a pixel array 202 coupled to a control circuitry 208 and a readout circuitry 204, which is coupled to a function logic 206.

Pixel array 202 is a two-dimensional ("2D") array of pixel cells 210 (e.g., pixels P1, P2 . . . , Pn). In one embodiment, each pixel is a complementary metal-oxide-semiconductor ("CMOS") imaging pixel. Pixel array 202 may be implemented as either a frontside illuminated image sensor array, or a backside illuminated image sensor array. In one embodiment, pixel array 202 includes a pixel array, such as the pixel array depicted in FIG. 1. The pixel array 202 includes a plurality of pixel cells 210. As illustrated, each pixel cell 210 is arranged into a row (e.g., rows R1 to Ry) and a column (e.g., column C1 to Cx) to acquire image data of a person, place, or object, which can then be used to render a 2D image of the person, place, or object. Each of pixel cell 210 may have been formed in the process depicted in FIGS. 2-11C.

In one embodiment, after each pixel cell 210 has acquired its image data or image charge, the image data is readout by readout circuitry 204 through bitlines 212 and transferred to function logic 206. Readout circuitry 204 may include amplification circuitry, e.g., a differential amplifier circuitry, analog-to-digital ("ADC") conversion circuitry, or otherwise.

Function logic 206 may include logic and memory for storing the image data or even manipulating the image data by applying post image effects (e.g., crop, rotate, remove red eye, adjust brightness, adjust contrast, or otherwise). In one example, the readout circuitry 204 may readout a row of image data at a time along readout column lines (illustrated) or may readout the image data using a variety of other techniques (not illustrated), such as a serial readout or a full parallel readout of all pixels simultaneously.

Control circuitry 208 is coupled to pixel array 202. Control circuitry 208 may include logic and memory for controlling operational characteristic of pixel array 202. For example, control circuitry 208 may generate a shutter signal for controlling image acquisition. In one embodiment, the shutter signal is a global shutter signal for simultaneously enabling all pixel cells 210 within pixel array 202 to simultaneously capture their respective image data during a single acquisition window. In an alternative embodiment, the shutter signal is a rolling shutter signal whereby each row, column, or group of pixels is sequentially enabled during consecutive acquisition windows.

As can be appreciated by the above description of the image sensor with split pixel structures and methods of manufacturing the same, the disclosure provides for an image sensor with improved performance with regards to high intensity light sensing.

The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that any specific examples of voltages, currents, frequencies, power range values, times, thicknesses etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a substrate having a first side and a second side opposite to the first side, wherein the substrate includes a small photodiode and a large photodiode adjacent to the small photodiode, and the substrate further includes a deep trench isolation structure in a region of the substrate between the small photodiode and the large photodiode, wherein the large photodiode has a first light exposure area larger than a second light exposure area of the small photodiode;
a first color filter disposed over the small photodiode and a second color filter disposed over the large photodiode, the first color filter and the second color filter are disposed over the first side of the substrate;
a first buffer layer disposed on the first side of the substrate;
a second buffer layer disposed between the first side of the substrate and the first and the second color filters, wherein the first and second buffer layers are horizontally placed with respect to each other, wherein the first buffer layer is disposed over the deep trench isolation structure, and the second buffer layer is over the second exposure area of the small photodiode and the first light exposure area of the large photodiode;
a metal grid structure disposed on the first buffer layer between the first color filter and the second color filter; and
an attenuation layer portion extending in a normal direction from a first side surface of the substrate such that the attenuation layer portion is disposed between the first buffer layer and the second buffer layer and between the metal grid structure and the first color filter above the small photodiode, wherein the metal grid structure and the first buffer layer form a stack structure above the deep trench isolation structure.

2. The image sensor of claim 1, further comprising a second attenuation layer portion which extends from an etch-stop layer on the first side surface of the substrate in the normal direction to at least the level of one of the first and the second buffer layers.

3. The image sensor of claim 2, wherein the attenuation layer portion and the second attenuation layer portion are disposed in proximity to the deep trench isolation structure.

4. The image sensor of claim 2, wherein the first buffer layer separates the attenuation layer portion from the second buffer attenuation layer portion.

5. The image sensor of claim 2, wherein the attenuation layer portion and the second attenuation layer portion are spaced and disconnected from each other.

6. The image sensor of claim 1, further comprising a second attenuation layer portion which extends from an etch-stop layer on the first side surface of the substrate in the normal direction to at least the metal grid structure, wherein the second attenuation layer portion and the attenuation layer portion are on opposite sides of the metal grid structure.

7. The image sensor of claim 1, further comprising a second attenuation layer portion which extends from an etch-stop layer on the first side surface of the substrate in the normal direction to at least a top of the metal grid structure.

8. The image sensor of claim 1, further comprising a second attenuation layer portion on the first side surface of the substrate extending laterally over an edge of the large photodiode.

9. The image sensor of claim 1, wherein the attenuation layer portion is further laterally extends in a direction parallel to the first side surface of the substrate to cover the second light exposure area above the small photodiode.

10. The image sensor of claim 1, wherein the attenuation layer portion further extends from a top of the metal grid structure, along a sidewall of the stack structure of the metal grid structure and the first buffer layer, laterally over the second light exposure area of the small photodiode below a microlens and above the first side surface of the substrate, and along a sidewall of a second stack structure of an adjacent second metal grid structure and the first buffer layer, to a top of the adjacent second metal grid structure.

11. An image sensor, comprising:
a substrate having a first side and a second side opposite to the first side, wherein the substrate includes a small photodiode and a large photodiode adjacent to the small photodiode, and the substrate further includes a deep trench isolation structure in a region of the substrate between the small photodiode and the large photodiode, wherein the large photodiode has a first light exposure area larger than a second light exposure area of the small photodiode;
a first color filter disposed over the small photodiode and a second color filter disposed over the large photodiode, the first color filter and the second color filter are disposed over the first side of the substrate;
a first buffer layer disposed on the first side of the substrate;
a second buffer layer disposed between the first side of the substrate and the first and the second color filters, wherein the first and second buffer layers are horizontally placed with respect to each other, wherein the first buffer layer is disposed over the deep trench isolation structure, and the second buffer layer is over the second exposure area of the small photodiode and the first exposure area of the large photodiode;
a metal grid structure disposed on the first buffer layer, wherein the metal grid structure is disposed between the first color filter and the second color filter; and
an attenuation layer portion disposed above the substrate between the large photodiode and the small photodiode, the attenuation layer portion is disposed between the first and the second buffer layers and normal to a first side surface of the substrate, wherein the attenuation layer portion includes a metal layer and a metal nitride layer.

12. The image sensor of claim 1, wherein the first buffer layer and the second buffer layer are formed of different materials.

13. The image sensor of claim 1, wherein the second buffer layer is disposed between a first microlens and the small photodiode and between a second microlens and the large photodiode.

14. The image sensor of claim 1, wherein the deep trench isolation structure extends from the upper surface of the substrate into the substrate and surrounds the small photodiode in the substrate.

15. The image sensor of claim 1, comprising the attenuation layer portion extending in a direction parallel to the first side surface such that the attenuation layer portion further is disposed between the second buffer layer and the first side surface of the substrate.

16. The image sensor of claim 1, wherein the attenuation layer portion is between the second buffer layer and the small photodiode.

17. The image sensor of claim 1, wherein the second buffer layer is in between adjacent portions of the first buffer layer.

18. The image sensor of claim 1, wherein a width of a portion of the second buffer layer above the large photodiode is greater than a width of a portion of the second buffer layer above the small photodiode.

19. The image of sensor of claim 1, wherein the metal grid structure and the first buffer layer separates light sensing regions of the large photodiode and the adjacent small photodiode.

20. The image sensor of claim 1, wherein the metal grid structure is one of a plurality of metal grid structures of a metal grid, and the metal grid and the first buffer layer define a first opening aligning with the first light exposure area of the large photodiode and a second opening aligning with the second light exposure area of the small photodiode.

21. The image sensor of claim 1, wherein the attenuation layer portion is a part of an attenuation layer, the attenuation layer having the attenuation layer portion laterally extending to cover the second light exposure area of the small photodiode, and the attenuation layer has an opening above the first light exposure area of the large photodiode.

22. The image sensor of claim 1, wherein the deep trench isolation structure is a first deep trench isolation structure, the metal grid structure is a first metal grid structure, and the large photodiode is a first large photodiode, the image sensor further comprising a second deep trench isolation structure separating the small photodiode from an adjacent second large photodiode, wherein a first stack structure includes the first metal strid structure and a corresponding first portion of the first buffer layer disposed above the first deep trench isolation structure, and a second stack structure includes a second metal grid structure and a corresponding second portion of the first buffer layer disposed above the second deep trench isolation structure, wherein the attenuation layer portion extending along a sidewall of the first stack structure of the first metal grid structure and the first portion of the first buffer layer, across the first side surface of the substrate over the small photodiode and continues to extend along a sidewall of the second stack structure of the second metal grid structure and the second portion of the first buffer layer.

23. The image sensor of claim 22, wherein the attenuation layer portion is configured to fully cover the second light exposure area of the small photodiode and block a portion of an incident light directed toward the small photodiode.

24. The image sensor of claim 23, wherein the incident light is directed from a microlens disposed above one of the adjacent large photodiodes.

* * * * *

UNITED STATES PATENT AND TRADEMARK OFFICE
CERTIFICATE OF CORRECTION

PATENT NO. : 11,362,121 B2
APPLICATION NO. : 16/775022
DATED : June 14, 2022
INVENTOR(S) : H. Zang et al.

Page 1 of 1

It is certified that error appears in the above-identified patent and that said Letters Patent is hereby corrected as shown below:

In the Claims

| Column | Line | |
|---|---|---|
| 12 | 53 | Claim 4, change "buffer attenuation" to -- attenuation --. |

Signed and Sealed this
Fourth Day of July, 2023

Katherine Kelly Vidal
*Director of the United States Patent and Trademark Office*